(12) United States Patent
Lee et al.

(10) Patent No.: US 10,089,922 B2
(45) Date of Patent: Oct. 2, 2018

(54) FLEXIBLE DISPLAY DEVICE AND METHOD FOR FABRICATING THE SAME

(71) Applicant: LG Display Co., Ltd., Seoul (KR)

(72) Inventors: Chanwoo Lee, Gyeonggi-do (KR); SungJoon Min, Gyeonggi-do (KR); KwonHyung Lee, Seoul (KR); Yeonjun Oh, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 21 days.

(21) Appl. No.: 14/983,876

(22) Filed: Dec. 30, 2015

(65) Prior Publication Data
US 2017/0032737 A1 Feb. 2, 2017

(30) Foreign Application Priority Data

Jul. 31, 2015 (KR) .......................... 10-2015-0109144

(51) Int. Cl.
G06F 3/038 (2013.01)
G09G 5/00 (2006.01)
G09G 3/3225 (2016.01)
H01L 51/00 (2006.01)
H01L 27/32 (2006.01)

(52) U.S. Cl.
CPC ............. G09G 3/3225 (2013.01); G09G 5/00 (2013.01); H01L 27/3267 (2013.01); H01L 51/003 (2013.01); H01L 51/0097 (2013.01); G06F 3/038 (2013.01); G09G 2310/0221 (2013.01); G09G 2310/0283 (2013.01); G09G 2380/02 (2013.01); H01L 2251/5338 (2013.01); H01L 2251/566 (2013.01); Y02E 10/549 (2013.01)

(58) Field of Classification Search
None
See application file for complete search history.

(56) References Cited

U.S. PATENT DOCUMENTS

2012/0194773 A1* 8/2012 Kim .................... G02F 1/13336
349/139
2014/0042406 A1* 2/2014 Degner ................. H01L 27/326
257/40

(Continued)

FOREIGN PATENT DOCUMENTS

CN 104521331 A 4/2015
CN 104716148 A 6/2015

OTHER PUBLICATIONS

The First Office Action dated Aug. 2, 2018, from the State Intellectual Property Office of People's Republic of China in counterpart Chinese application No. 201511020977.0.

Primary Examiner — Stephen T Reed
(74) Attorney, Agent, or Firm — Morgan, Lewis & Bockius LLP

(57) ABSTRACT

A flexible display device includes a flexible substrate includes first and second portions that overlap each other, and a bending portion connecting the first portion with the second portion. A first display having a first organic light emitting diode is on the first portion, the first display configured to display an image in a first direction, and a second display having a second organic light emitting diode is on the second portion, the second display configured to display an image in a second direction. A gate driver is on the bending portion, and is configured to drive gate lines in each of the first and second displays.

12 Claims, 15 Drawing Sheets

(56) References Cited

U.S. PATENT DOCUMENTS

| | | | |
|---|---|---|---|
| 2014/0049449 A1* | 2/2014 | Park | G09G 5/00 |
| | | | 345/1.3 |
| 2014/0354143 A1* | 12/2014 | Jung | H01L 51/0097 |
| | | | 313/511 |
| 2015/0008396 A1 | 1/2015 | Naijo | |
| 2015/0130777 A1* | 5/2015 | Park | G09G 3/2085 |
| | | | 345/206 |
| 2016/0109908 A1* | 4/2016 | Siddiqui | G06F 1/1618 |
| | | | 361/679.27 |
| 2016/0209877 A1* | 7/2016 | Chong | G06F 1/1652 |
| 2017/0133407 A1 | 5/2017 | Sun et al. | |

* cited by examiner

FLEXIBLE DISPLAY DEVICE AND METHOD FOR FABRICATING THE SAME

CROSS REFERENCE TO RELATED APPLICATIONS

This application claims the benefit of the Korean Patent Application No. 10-2015-0109144 filed on Jul. 31, 2015, which is hereby incorporated by reference for all purposes as if fully set forth herein.

BACKGROUND

Technical Field

The present invention relates to a flexible display device.

Discussion of the Related Art

Examples of a display device used for a monitor of a computer, a TV, a cellular phone, etc., include an organic light emitting display (OLED), a plasma display panel (PDP), and a liquid crystal display (LCD). The OLED and the PDP emit light by themselves, while the LCD needs a separate light source.

Recently, a flexible display device fabricated of a flexible material, such as a plastic, has received attention as a next generation display device, and may display an image even in the example that the device is flexible like paper.

Such a flexible display device has various applications, ranging from personal portable device to monitors of a computer, TVs, and more, and a flexible display device that has a reduced volume and a reduced weight, while keeping a wide display area, has been studied.

Mass production of flexible display devices has been recently applied to small mobile products, TVs, etc., while manufacturers of display devices continue to study development of a more advanced type of display device using flexible properties.

SUMMARY

Accordingly, embodiments of the present invention are directed to a flexible display device and a method for fabricating the same, which substantially obviate one or more problems due to limitations and disadvantages of the related art.

An object of embodiments of the present invention is to provide a new type of flexible display device based on a property of a flexible substrate and a method for fabricating the same, and to provide a structure for reducing a bezel area where an image is not displayed and a method for fabricating the same.

To achieve these objects and other advantages and in accordance with the purpose of embodiments of the invention, as embodied and broadly described herein, a flexible display device comprises a flexible substrate including first and second portions that overlap each other, and a bending portion connecting the first portion with the second portion; a first display having a first organic light emitting diode on the first portion, the first display configured to display an image in a first direction; a second display having a second organic light emitting diode on the second portion, the second display configured to display an image in a second direction; and a gate driver on the bending portion, the gate driver configured to drive gate lines in each of the first and second displays.

In another aspect, a method for fabricating a flexible display device comprises attaching a mother flexible substrate to a support substrate; forming a thin film transistor array on the mother flexible substrate to define a plurality of unit areas; forming an organic light emitting diode on the thin film transistor array; forming a unit flexible substrate by cutting the support substrate and the mother flexible substrate to include two unit areas adjacent to each other; connecting a driving circuit to each of the two unit areas; separating the support substrate from the unit flexible substrate; and bending the unit flexible substrate based on a center line between the two unit areas such that the two unit areas overlap with each other.

In another aspect, a flexible display device comprises a flexible substrate including a bending portion concavely bent along a center line, and first and second portions at opposite ends of the bending portion; a first display having a first organic light emitting diode on the first portion; and a second display having a second organic light emitting diode on the second portion.

In another aspect, a method for fabricating a flexible display device comprises attaching a mother flexible substrate to a support substrate; forming a thin film transistor array on the mother flexible substrate to define a plurality of unit areas; forming an organic light emitting diode on the thin film transistor array; forming a unit flexible substrate by cutting the support substrate and the mother flexible substrate to include two unit areas adjacent to each other; connecting a driving circuit to each of the two unit areas; separating the support substrate from the unit flexible substrate; and concavely bending the unit flexible substrate based on a center line between the two unit areas to allow one side of one of the two unit areas to be in contact with one side of the other one of the two unit areas.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain principles of the invention. In the drawings.

DETAILED DESCRIPTION

Terms disclosed in this specification should be understood as follows. The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, example embodiments of a flexible display device and a method for fabricating the same according to the present invention will be described with reference to the accompanying drawings.

Figure 1:
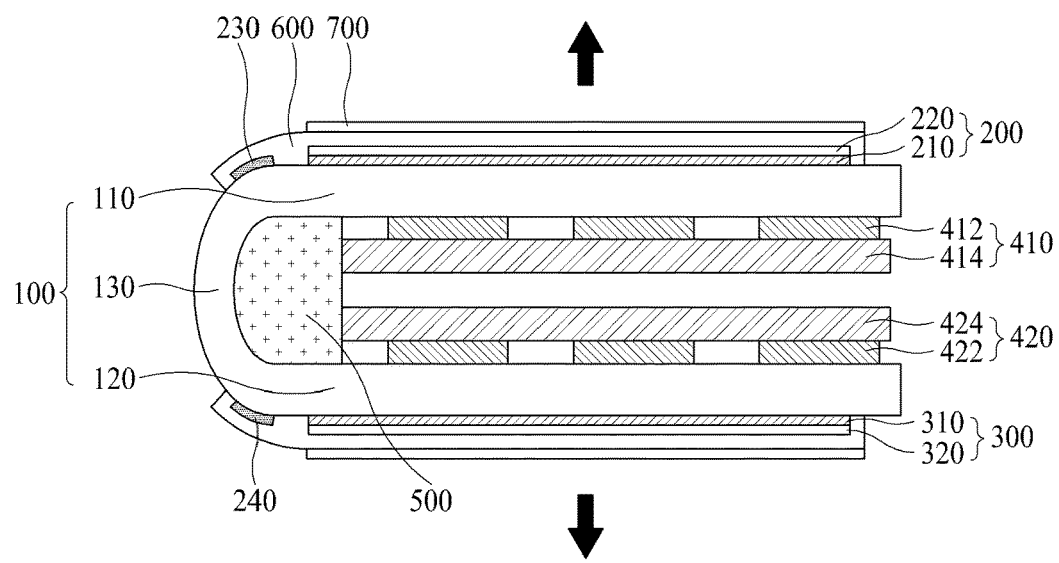
FIG. 1 is a cross-sectional view illustrating a flexible display device according to the first example embodiment of the present invention.
Figure 2:
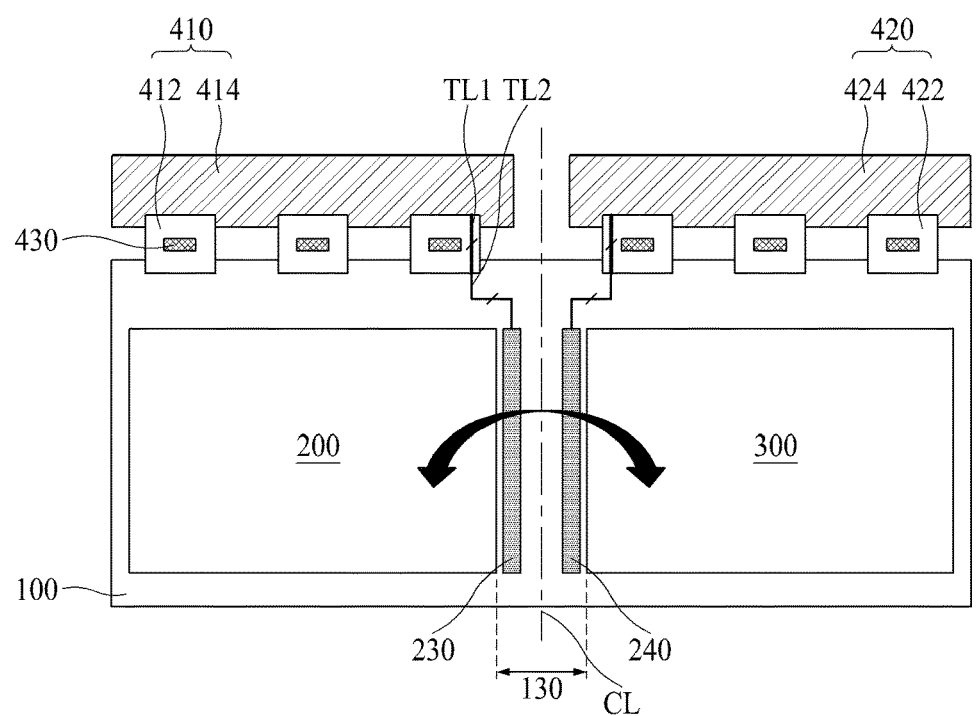
FIG. 2 is a plane view illustrating an example state before a substrate is bent in fabricating a flexible display device as shown in FIG. 1.

FIG. 1 is a cross-sectional view illustrating a flexible display device according to the first example embodiment of the present invention. FIG. 2 is a plane view illustrating a state before a substrate is bent in fabricating a flexible display device shown in FIG. 1.

With reference to FIG. 1, the flexible display device according to the first example embodiment includes a flexible substrate 100, first and second display units 200 and 300 arranged on the flexible substrate 100, and a driving circuit 400 connected to one side of the flexible substrate 100.

The flexible substrate 100 has a bending property. To this end, plastic, which includes polyethylene naphthalate, polyethylene terephthalate, polycarbonate and polyethersulfone, and a metal foil, which includes Stainless Steel (SUS), may be used as materials of the flexible substrate 100.

One side of the flexible substrate 100 is bent. In more detail, as shown in FIG. 2, the flexible substrate 100 is bent based on its center line CL. That is, the flexible substrate 100 according to the first example embodiment is formed such that that the first and second display units 200 and 300 are formed on the flexible substrate 100, which is flat, and then the flexible substrate 100 is bent.

Therefore, the flexible substrate 100 includes a first portion 110, a second portion 120, and a bending portion 130, wherein the first portion 110 and the second portion 120 overlap with each other when the flexible substrate 100 is bent. The first portion 110 and the second portion 120 have the same shapes and areas as each other. One side of the first portion 110 is connected to one side of the second portion 120 by the bending portion 130.

In this example, the bending portion 130 of the flexible substrate 100 is fixed with a specific curvature. To this end, a support member 500 for supporting and fixing the flexible substrate 100 is disposed on the bending portion 130.

A cross-section of the support member 500 includes a flat surface and a curved surface convexedly extended from the flat surface to one side, and having a specific curvature. The curved surface of the support member 500 is arranged toward the center line CL of the flexible substrate 100. In this example, the center line CL is disposed at the bending portion 130 of the flexible substrate 100.

The first display unit 200 is disposed on the first portion 110 of the flexible substrate 100. The first display unit 200 includes a first organic light emitting diode 220 displaying an image in a first direction.

In more detail, the first display unit 200 may include a thin film transistor array 210 disposed on the first portion 110 of the flexible substrate 100, a first organic light emitting diode 220 deposited on the thin film transistor array 210, and an encapsulation layer 600 covering the first organic light emitting diode 220.

The first direction may be an upward direction of the flexible substrate 100. Therefore, the first organic light emitting diode 220 displays an image in an upward direction of the flexible substrate 100.

The second display unit 300 is disposed on the second portion 120 of the flexible substrate 100. The second display unit 300 includes a second organic light emitting diode 320 displaying an image in a second direction.

In more detail, the second display unit 300 may include a thin film transistor array 310 disposed on the second portion 120 of the flexible substrate 100, a second organic light emitting diode 320 deposited on the thin film transistor array 310, and an encapsulation layer 600 covering the second organic light emitting diode 320. In this example, the second organic light emitting diode 320 displays an image in a second direction.

The second direction may be a downward direction of the flexible substrate 100. Therefore, the second organic light emitting diode 320 displays an image in a downward direction of the flexible substrate 100.

As described above, in the flexible display device according to the first example embodiment of the present invention, one side of the flexible substrate 100 is bent. The organic light emitting diodes 220 and 320 are respectively arranged on the first portion 110 and the second portion 120 of the flexible substrate 100, which overlap each other, whereby a dual display device displaying an image in dual directions is realized.

In an example, the first and second organic light emitting diodes 220 and 320 include a structure of an anode electrode, a hole injection layer, an organic light emitting layer, an electron injection layer, and a cathode electrode, deposited in due order.

Emission principles of the first and second organic light emitting diodes 220 and 320 will briefly be described as follows. If electrons generated from the cathode electrode and holes generated from the anode electrode are injected into the light emitting layer, excitons are generated by a combination of the injected electrons and holes. Then, the excitons are transited from an excited state to a ground state to emit light, whereby an image is displayed.

As shown in FIG. 1, a polarizing film 700 for improving an ambient contrast ratio (ACR) may be provided on the uppermost layers of the first and second display units 200 and 300.

The driving circuit 400 includes a first driving circuit 410 connected to the first portion 110 of the flexible substrate 100 and a second driving circuit 420 connected to the second portion 120 of the flexible substrate 100.

The first driving circuit 410 includes a printed circuit board 414 provided at one side of the flexible substrate 100 and a plurality of circuit films 412 connecting the printed circuit board 414 with the flexible substrate 100.

The printed circuit board 414 is provided with a control circuit, which is not shown, and a driving voltage generating circuit. In this example, the printed circuit board 414 may be a flexible printed circuit board (FPCB).

The plurality of circuit films 412 may be chip on films (COF), each of which may be provided with a data drive integrated circuit (IC) 430 packaged therein.

The printed circuit board 414 and the plurality of circuit films 412 are folded with respect to a rear surface of the flexible substrate 100 and then arranged between the first portion 110 and the second portion 120 of the flexible substrate 100 as the flexible substrate 100 is bent.

The second driving circuit 420 includes elements substantially the same as those of the first driving circuit 410. That is, the second driving circuit 420 includes a printed circuit board 424 provided at one side of the flexible substrate 100 and a plurality of circuit films 422 connecting the printed circuit board 424 with the flexible substrate 100.

Meanwhile, the first driving circuit 410 further includes a first gate driver 230 for driving a plurality of gate lines provided in the first display unit 200. The first gate driver 230 is provided at one side of the first display unit 200.

Also, the second driving circuit 420 further includes a second gate driver 240 for driving a plurality of gate lines provided in the second display unit 300. The second gate driver 240 is provided at one side of the second display unit 300.

The first and second gate drivers 230 and 240 are disposed between the first display unit 200 and the second display unit 300. Therefore, a plurality of gate signal transmission lines TL2 for transmitting a plurality of first and second gate control signals provided respectively from the first and second driving circuits 410 and 420 to each of the first and second gate drivers 230 and 240 are arranged between the first display unit 200 and the second display unit 300.

In the first example embodiment, the gate drivers and the gate signal transmission lines TL2 for transmitting the plurality of gate control signals to the gate drivers are arranged in the bending portion 130. According to example embodiments of the present invention, the gate drivers 230 and 240 and the plurality of gate signal transmission lines TL2 are not arranged in an outer bezel area of each of the first and second display units 200 and 300, whereby a width of the outer bezel area may be reduced.

Meanwhile, in the first example embodiment, as the plurality of gate signal transmission lines TL2 are arranged in the bending portion 130, a structure for the plurality of gate signals to be transferred from the printed circuit board 414 to the flexible substrate 100 is varied. This will be described in more detail as follows.

Generally, the circuit films 412 may package the data drive IC 430 therein to drive the data lines arranged in the display unit. Some of the plurality of circuit films 412 transfer gate control signals and a driving voltage, provided from the printed circuit board 414, to the flexible substrate 100.

To this end, in the display device of the related art, a transfer line TL1 for transferring gate control signals and a driving voltage provided form the printed circuit board 414 to the flexible substrate 100 may be provided in the outermost circuit film 412 among the plurality of circuit films 412. This is because a gate driver is provided at one side of the flexible substrate 100.

On the other hand, in the first example embodiment, because the gate driver is arranged along the bending portion 130 of the flexible substrate 100, that is, the center line CL, the transfer line TL1 is arranged in the circuit film 412 arranged at the center among the plurality of circuit films 412. For example, with reference to the example shown in FIG. 2, if six circuit films 412 are provided, the transfer line TL1 is arranged at the third and fourth circuit films 412.

Hereinafter, a method for fabricating the aforementioned flexible display device according to the first example embodiment of the present invention will be described in detail.

Figure 3A:
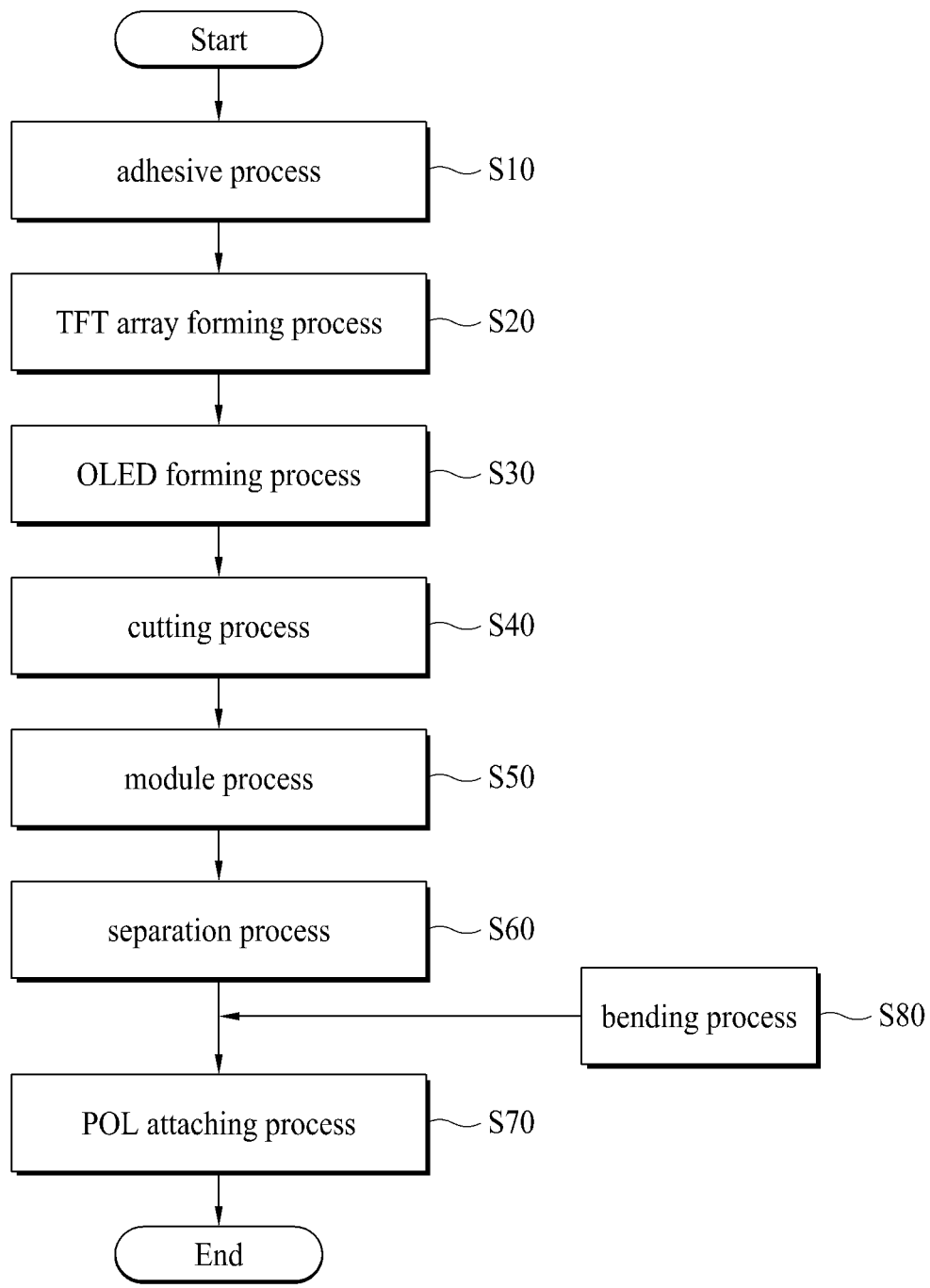
FIGS. 3A and 3B are flow charts of a method for fabricating a flexible display device according to the first example embodiment of the present invention.
Figure 3B:
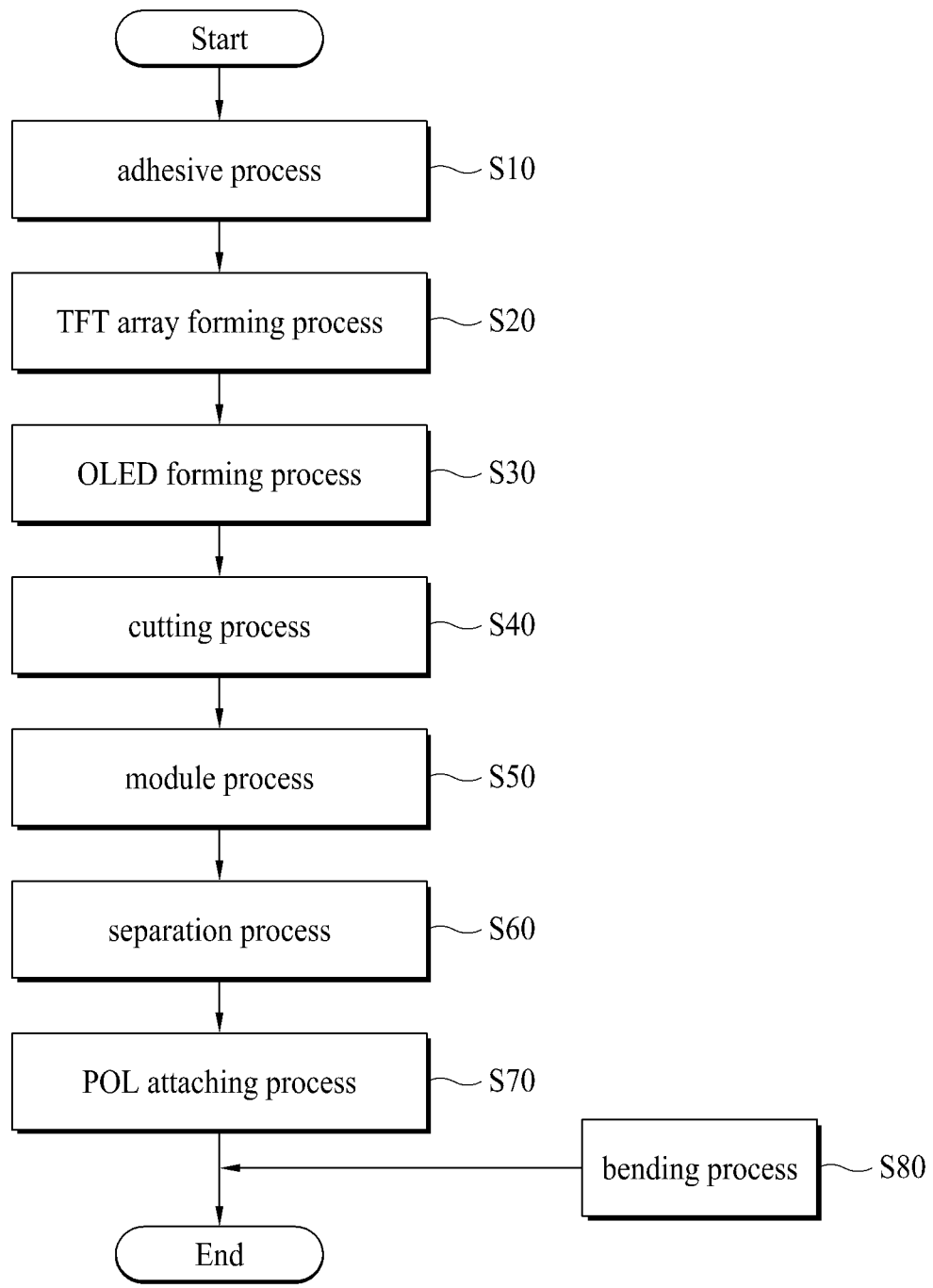
Figure 4:
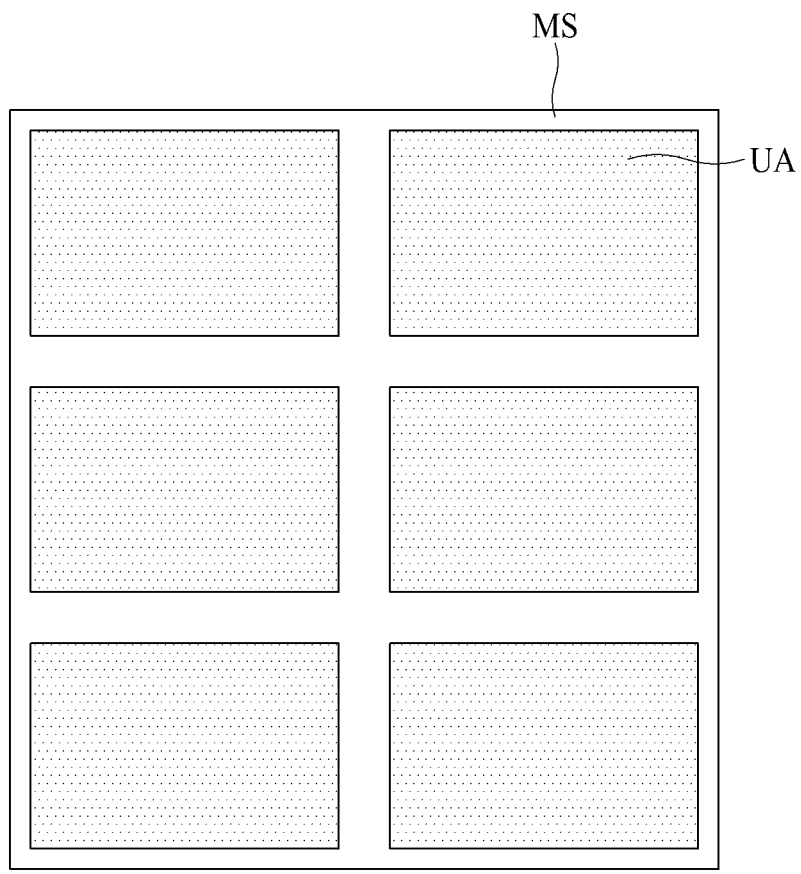
FIG. 4 is a plane view illustrating a mother flexible substrate.

FIGS. 3A and 3B are flow charts of a method for fabricating a flexible display device according to the first example embodiment of the present invention. FIG. 4 is a plane view illustrating a mother flexible substrate MS. FIGS. 5A to 5H illustrate a method for fabricating a flexible display device according to the first example embodiment of the present invention.

With reference to FIGS. 3A and 3B, the method for fabricating the flexible display device according to the first example embodiment includes a step (first process) S10 of attaching the mother flexible substrate MS to the support substrate 1000, a step (second process) S20 of forming the thin film transistor array 210 on the mother flexible substrate MS, a step (third process) S30 of forming an organic light emitting diode on the thin film transistor array 210, a step (fourth process) S40 of cutting the mother flexible substrate MS, a module step (fifth process) S50 of connecting the driving circuit 400 to a unit area UA formed by cutting of the mother flexible substrate MS, a step (sixth process) S60 of separating the support substrate 1000 from the mother flexible substrate MS, and a step (sixth process) S70 of attaching the polarizing film 700 to each unit area UA.

In the first example embodiment, the method further includes a step (eighth process) S80 of bending the mother flexible substrate MS after cutting the mother flexible substrate MS. The eighth process S80 may be performed before or after the step of attaching the polarizing film 700 to each unit area UA.

Figure 5A:
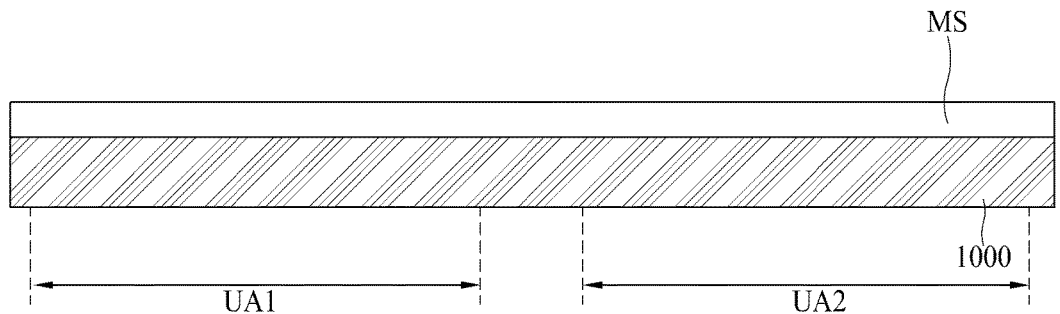
FIGS. 5A to 5H illustrate a method for fabricating a flexible display device according to the first example embodiment of the present invention.

With reference to FIG. 5A, the first process S10 is to attach the mother flexible substrate MS to the support substrate 1000 to facilitate handling of the mother flexible substrate MS during the processes. The support substrate 1000 is attached to the rear surface of the flexible substrate 100 such that the mother flexible substrate MS is neither easily bent nor distorted during a later process. To this end, a glass substrate thicker than the mother flexible substrate MS may be used as the support substrate 1000.

The mother flexible substrate MS is divided into a plurality of unit areas UA. Each of the plurality of unit areas UA corresponds to a single unit display device. In the drawing, one mother flexible substrate MS is configured to generate six unit display devices. However, the number of unit display devices that may be generated by one mother flexible substrate MS is not limited to the examples shown and described herein.

Figure 5B:
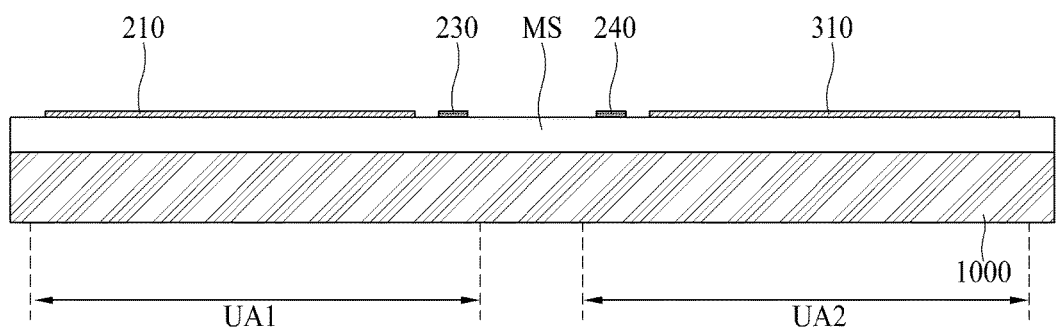

With reference to FIG. 5B, the second process S20 is to form the thin film transistor array 210 after the first process S10. The thin film transistor array 210 is formed per the plurality of unit areas UA. The thin film transistor array 210 includes gate lines, data lines crossing the gate lines, a plurality of signal transmission lines, a plurality of pad electrodes, and a thin film transistor connected to the gate and data lines.

The second process S20 includes the step of forming a gate driver and a plurality of gate signal lines TL2 connected to the gate driver between neighboring unit areas UA adjacent to each other. In this example, the gate driver includes first and second gate drivers 230 and 240 arranged to be adjacent to each other. The first gate driver 230 is connected to the first unit area UA of the neighboring unit areas, which is arranged at one side, and the second gate driver 240 is connected to the second unit area UA of the neighboring unit areas, which is arranged at the other side.

Figure 5C:
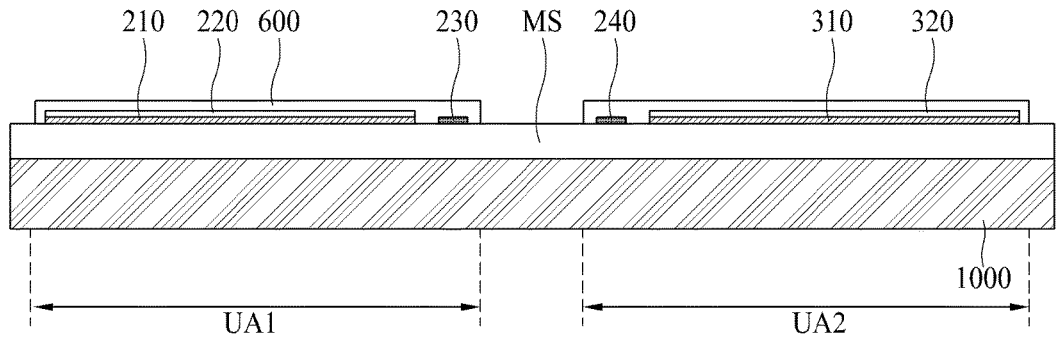

With reference to FIG. 5C, the third process S30 is to form the organic light emitting diode after the second process S20. The organic light emitting diode is formed for each of the plurality of unit areas UA. The organic light emitting diode is divided into the first light emitting device 220 and the second light emitting device 320 during a later process. In more detail, in the later fourth process S40, the mother flexible substrate MS is cut on a basis of two unit areas UA, whereby the organic light emitting diode is divided into the first organic light emitting diode 220 and the second organic light emitting diode 320, which are arranged respectively in two unit areas UA.

Figure 5D:
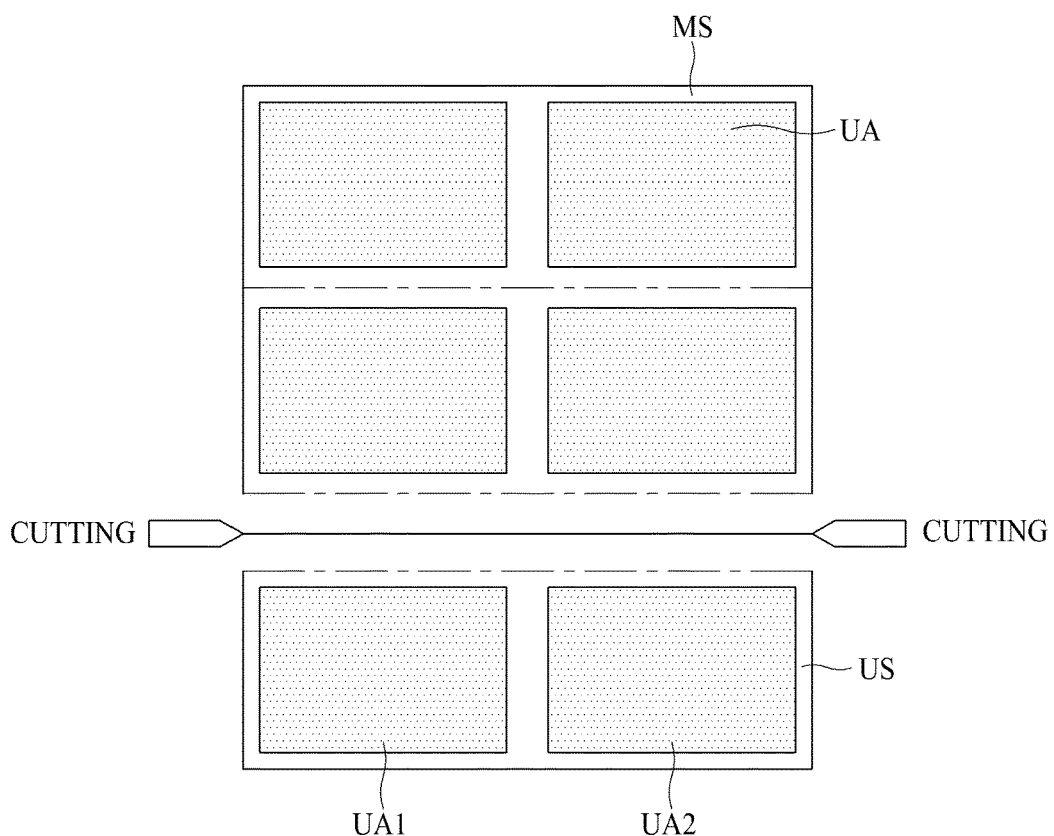

With reference to FIG. 5D, the fourth process S40 is to cut the mother flexible substrate MS on a basis of two unit areas UA after the third process S30. In more detail, the fourth process S40 is to cut the mother flexible substrate MS on a basis of the outside of the unit area UA, in accordance with the intended use of the display, and/or design specifications. The method for fabricating the flexible display device according to the first example embodiment may facilitate realization of a dual display device by cutting two unit areas UA at a time, and thereby improve process throughput.

Hereinafter, for convenience of description, each mother flexible substrate MS separated by cutting two unit areas UA during the fourth process S40 will be termed a "unit flexible substrate US." For example, in FIG. 4, one mother flexible substrate MS is configured to generate six unit display devices. In this example, the one mother flexible substrate MS is cut to generate three unit flexible substrates US. For reference, the flexible substrate 100 shown in FIGS. 1 and 2 represents one unit flexible substrate US.

Figure 5E:
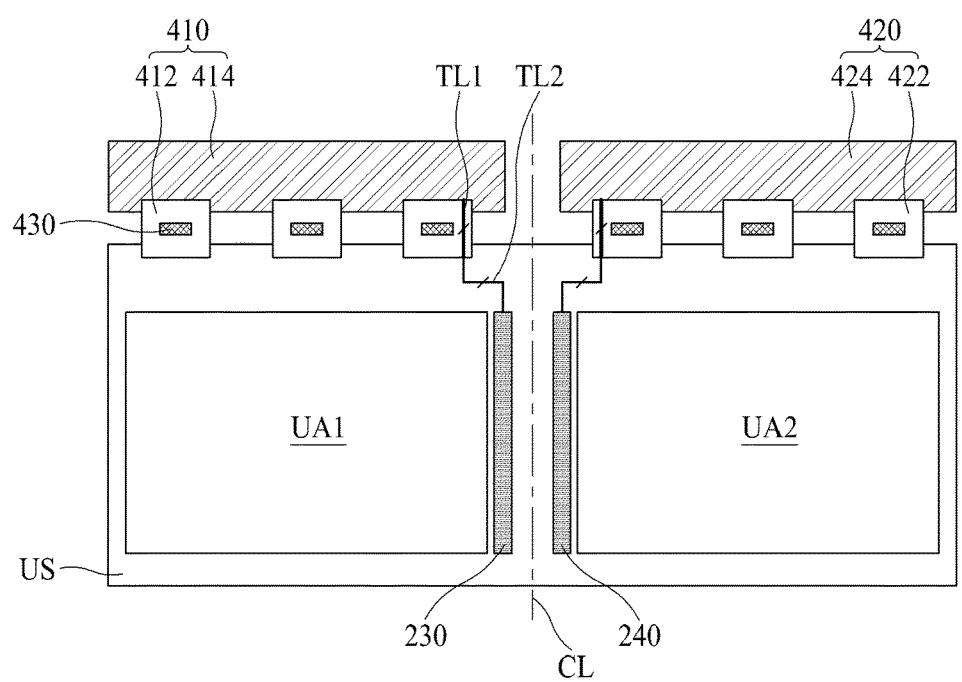

With reference to FIG. 5E, the fifth process S50 is to connect the driving circuit 400 after the fourth process S40. In more detail, the fifth process S50 is to connect the driving circuit 400 to a plurality of pads formed on the unit flexible substrate US during the second process S20. At this time, the circuit films 412 of the driving circuit 400 are connected to the plurality of pads in a type of tape automated bonding (TAB). Therefore, each unit area UA is connected to the printed circuit board 414 through the circuit films 412.

Figure 5F:
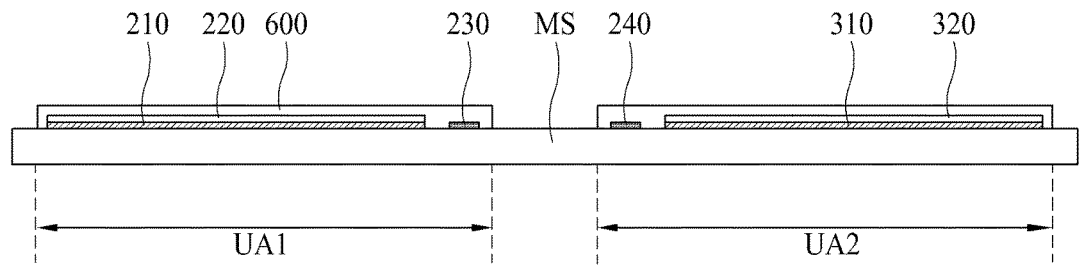

With reference to FIG. 5F, the sixth process S60 is to separate the support substrate 1000 from the unit flexible substrate US. The unit flexible substrate US has flexibility after the sixth process S60.

Figure 5G:
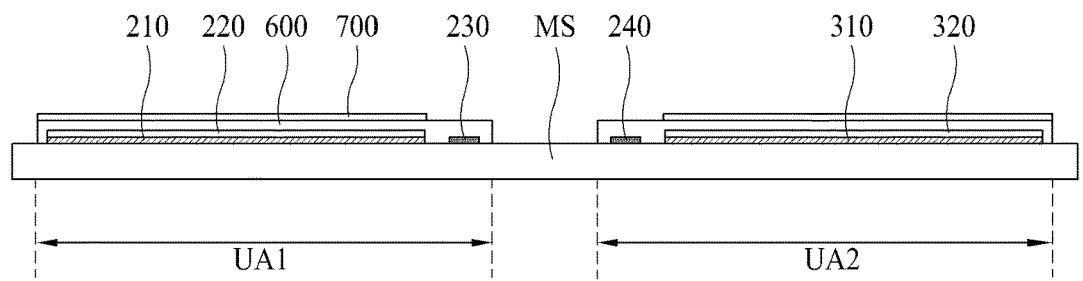

With reference to FIG. 5G, the seventh process S70 is to attach the polarizing film 700 to each unit area UA. The polarizing film 700 is attached to an encapsulation substrate 600, which encapsulates the first and second organic light emitting diodes 220 and 320, and serves to improve an ambient contrast ratio (ACR).

Figure 5H:
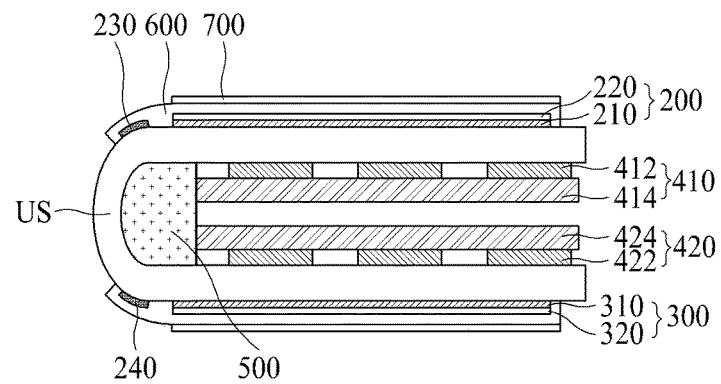

With reference to FIG. 5H, the eighth process S80 is to bend the unit flexible substrate US. In more detail, the eighth process S80 is to superimpose two unit areas UA on each other by bending the unit flexible substrate US based on the center line CL arranged between the two unit areas UA. In this eighth process S80, the printed circuit board 414 and the plurality of circuit films 412 are folded toward the rear surface of the flexible substrate 100. That is, the printed circuit board 414 and the plurality of circuit films 412 are arranged between the first portion 110 and the second portion 120 of the unit flexible substrate US as the unit flexible substrate US is bent.

Figure 6:
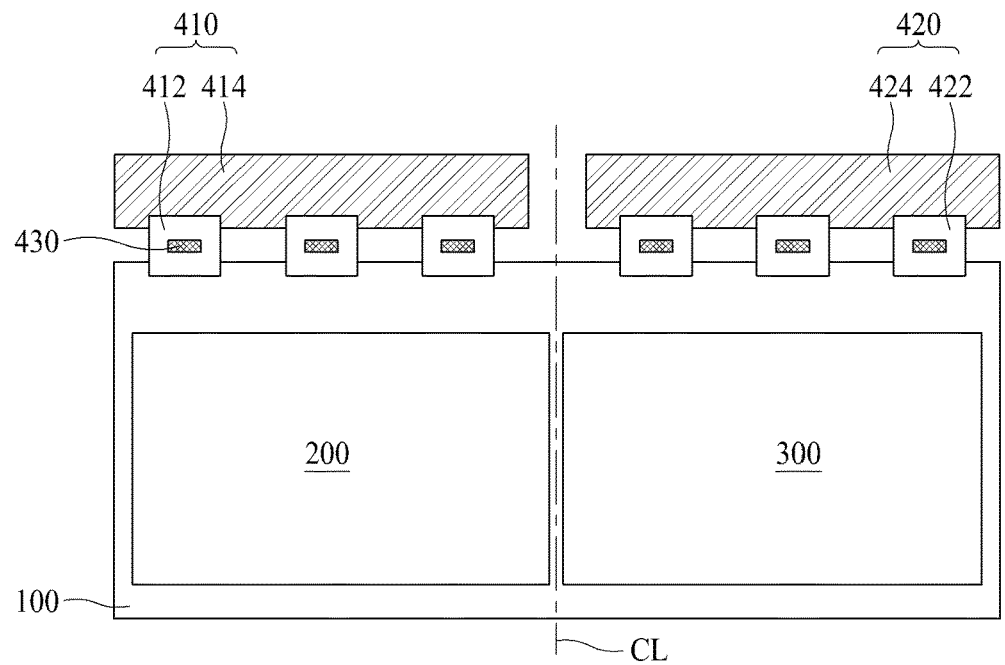
FIG. 6 is a plane view illustrating a flexible display device according to the second example embodiment of the present invention.
Figure 7:
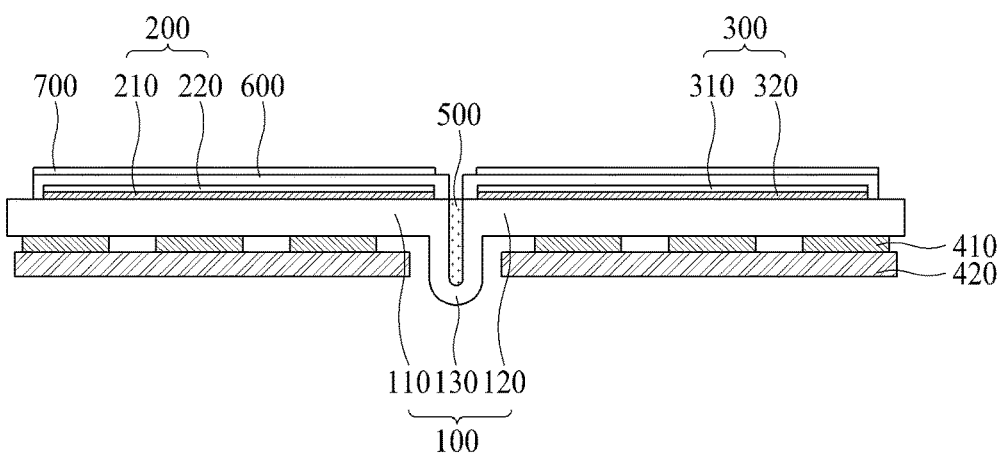
FIG. 7 is a cross-sectional view illustrating a flexible display device as shown in FIG. 6.
Figure 8:
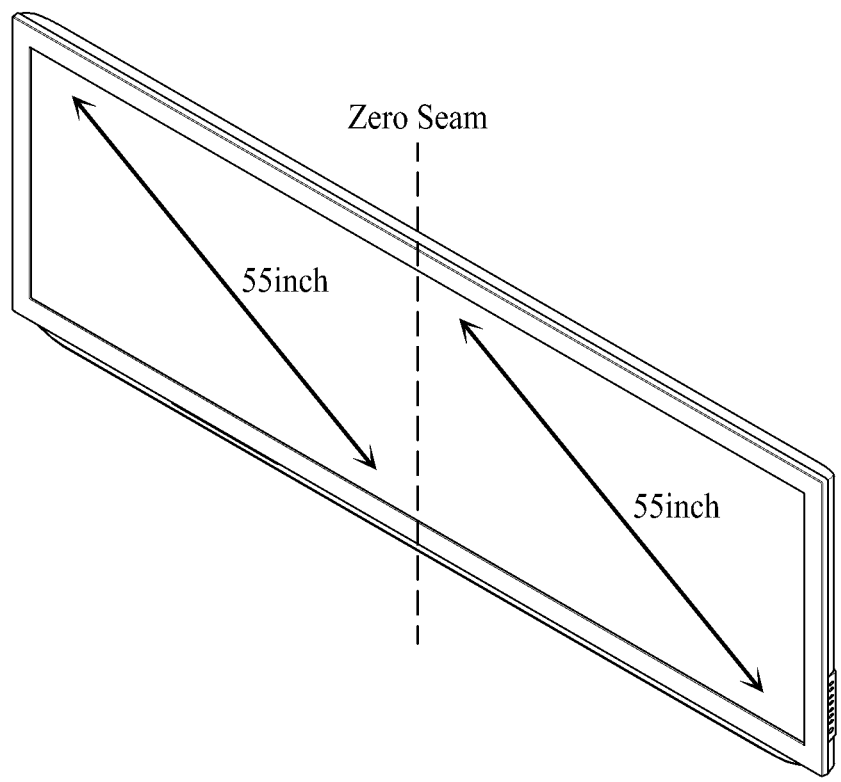
FIG. 8 illustrates a 100 inch TV to which embodiments of the present invention are applied.

FIG. 6 is a plane view illustrating a flexible display device according to a second example embodiment of the present invention. FIG. 7 is a cross-sectional view illustrating a flexible display device shown in FIG. 6. FIG. 8 illustrates a 100 inch TV to which embodiments of the present invention are applied.

With reference to FIG. 6, the flexible display device according to the second example embodiment includes a flexible substrate 100, first and second display units 200 and 300 disposed on the flexible substrate 100, and a driving circuit 400 connected to one side of the flexible substrate 100.

The flexible substrate 100 has a bending property. To this end, plastic, which includes polyethylene naphthalate, polyethylene terephthalate, polycarbonate and polyethersulfone, and a metal foil, which includes stainless steel (SUS), may be used as materials of the flexible substrate 100.

A center area of the flexible substrate 100 is bent. In more detail, as shown in FIG. 6, the flexible substrate 100 has a bending portion 130 concavely bent based on its center line CL.

Therefore, the flexible substrate 100 includes a first portion 110, a second portion 120, and a bending portion 130 arranged between the first and second portions 110 and 120, wherein the first portion 110 and the second portion 120 have the same height as each other. That is, the bending portion 130 is formed along the center line CL, and the first and second portions 110 and 120 are arranged at both sides of the bending portion 130. The first and second portions 110 and 120 may have the same shape and the same area as each other.

In the second example embodiment, as the bending portion 130 is formed along the center line CL, an interval between the display units provided in each of the first and second portions 110 and 120 may be reduced.

In this example, the bending portion 130 of the flexible substrate 100 is fixed with a specific curvature. To this end, a support member 500 for supporting and fixing the flexible substrate 100 is disposed on the bending portion 130.

A cross-section of the support member 500 includes a flat surface having the same height as those of the first and second portions 110 and 120 and a curved surface concavely extended from the flat surface to a lower side, and having a specific curvature. The curved surface of the support member 500 is arranged toward a rear surface of the flexible substrate 100.

The first display unit 200 is disposed on the first portion 110 of the flexible substrate 100. In more detail, the first display unit 200 may include a thin film transistor array 210 disposed on the first portion 110 of the flexible substrate 100, a first organic light emitting diode 220 deposited on the thin film transistor array 210, and an encapsulation layer 600 covering the first organic light emitting diode 220.

The second display unit 300 is disposed on the second portion 120 of the flexible substrate 100. In more detail, the second display unit 300 may include a thin film transistor array 310 disposed on the second portion 120 of the flexible substrate 100, a second organic light emitting diode 320 deposited on the thin film transistor array 310, and an encapsulation layer 600 covering the second organic light emitting diode 320.

As described above, in the flexible display device according to the second example embodiment of the present invention, the center area of the flexible substrate 100 is bent concavely. In example embodiments of the present invention as above, the first and second display units 200 and 300, which may be driven independently from each other, are connected with each other, whereby a multi-vision display device may be realized. A width of a non-display area disposed between the first and second display units 200 and 300 is reduced by the bending portion 130, whereby a seam area between the first and second display units 200 and 300 may be realized to be close to or about zero.

Therefore, in embodiments of the present invention, two independent unit display devices may be connected to each other, and at the same time, a zero or about zero seam may be realized, whereby a large scale display device may easily be realized. For example, 100 inch TVs, as mass-produced by manufacturers of display devices, have been expensive products up to now, but their manufacture may be facilitated and their manufacturing cost may be reduced if two 55 inch display panels are connected to each other, as shown in FIG. 8 and in accordance with embodiments of the present invention.

According to embodiments of the present invention, because the first and second display units 200 and 300, which are independent from each other, are connected to each other, a large scale TV may be realized. For this reason, 120 Hz driving, which may be difficult to realize in conventional 100 inch-TVs due to RC delay, may be more easily realized. Images of higher quality may therefore be provided.

For reference, the 120 Hz driving technique may provide images of high quality by providing images of 120 frames per 1 second. The 120 Hz driving technique may be applied to a 55 inch display device. However, due to RC delay in the signal lines, it has been difficult to realize the 120 Hz driving technique in a large scale display screen. For this reason, the 120 Hz driving technique has typically not been applied to display devices of more than 55 inches.

With reference to the first and second organic light emitting diodes 220 and 320 of the second example embodiment, these diodes include a structure of an anode electrode, a hole injection layer, an organic light emitting layer, an electron injection layer, and a cathode electrode, deposited in due order.

Emission principles of the first and second organic light emitting diodes 220 and 320 are similar to those of the first example embodiment, but will briefly be described as follows. If electrons generated from the cathode electrode and holes generated from the anode electrode are injected into the light emitting layer, excitons are generated by combination of the injected electrons and holes. Then, the excitons are transited from an excited state to a ground state to emit light, whereby an image is displayed.

As shown in FIG. 7, a polarizing film 700 for improving an ambient contrast ratio (ACR) may be provided on the uppermost layers of the first and second display units 200 and 300.

The driving circuit 400 includes a first driving circuit 410 connected to the first portion 110 of the flexible substrate 100 and a second driving circuit 420 connected to the second portion 120 of the flexible substrate 100.

The first driving circuit 410 includes a printed circuit board 414 provided at one side of the flexible substrate 100, and a plurality of circuit films 412 connecting the printed circuit board 414 with the flexible substrate 100.

The printed circuit board 414 is provided with a control circuit, which is not shown, and a driving voltage generating circuit. In this example, the printed circuit board 414 may be a flexible printed circuit board (FPCB).

The plurality of circuit films 412 may be chip on films (COF), each of which may be packaged with a data drive integrated circuit (IC) 430 therein.

The second driving circuit 420 includes elements substantially the same as those of the first driving circuit 410. That is, the second driving circuit 420 includes a printed circuit board 424 provided at one side of the flexible substrate 100, and a plurality of circuit films 422 connecting the printed circuit board 424 with the flexible substrate 100.

Meanwhile, the first driving circuit 410 further includes a first gate driver 230 for driving a plurality of gate lines provided in the first display unit 200. The first gate driver 230 is provided at one side of the first display unit 200. Also, the second driving circuit 420 further includes a second gate driver 240 for driving a plurality of gate lines provided in the second display unit 300. The second gate driver 240 is provided at one side of the second display unit 300.

The first and second gate drivers 230 and 240 are disposed between the first display unit 200 and the second display unit 300. Therefore, a plurality of gate signal transmission lines TL2 for transmitting a plurality of first and second gate control signals provided from the first and second driving circuits 410 and 420 to each of the first and second gate drivers 230 and 240 are arranged between the first display unit 200 and the second display unit 300.

In the second example embodiment, the gate drivers and the gate signal transmission lines TL2 for transmitting the plurality of gate control signals to the gate drivers are arranged in the bending portion 130. According to example embodiments of the present invention, the gate drivers 230 and 240 and the plurality of gate signal transmission lines TL2 are not arranged in an outer bezel area of each of the first and second display units 200 and 300, whereby a width of the outer bezel area may be reduced.

Hereinafter, a method for fabricating the aforementioned flexible display device according to the second example embodiment of the present invention will be described in detail.

Figure 9A:
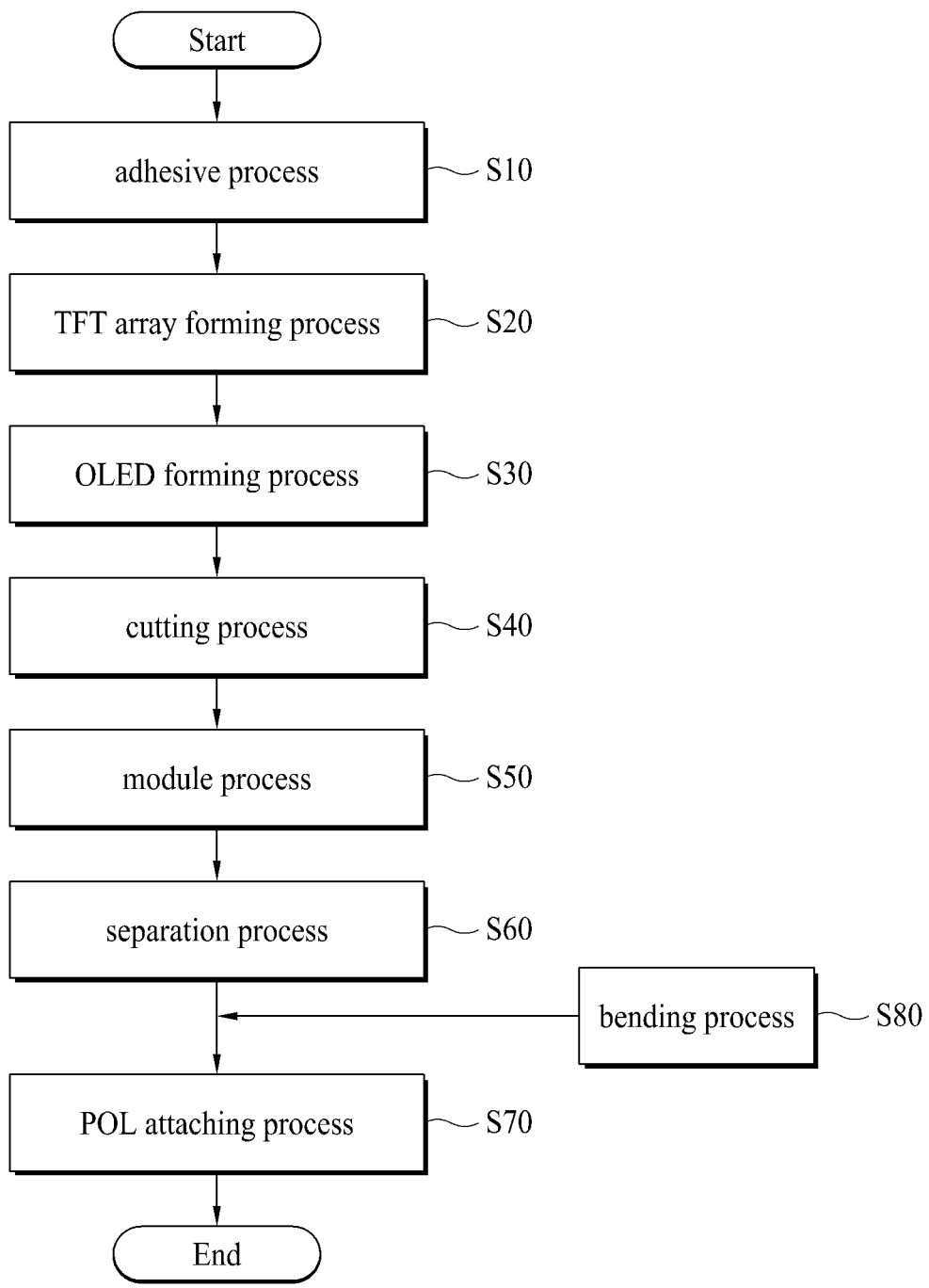
FIGS. 9A and 9B are flow charts of a method for fabricating a flexible display device according to the second example embodiment of the present invention.
Figure 9B:
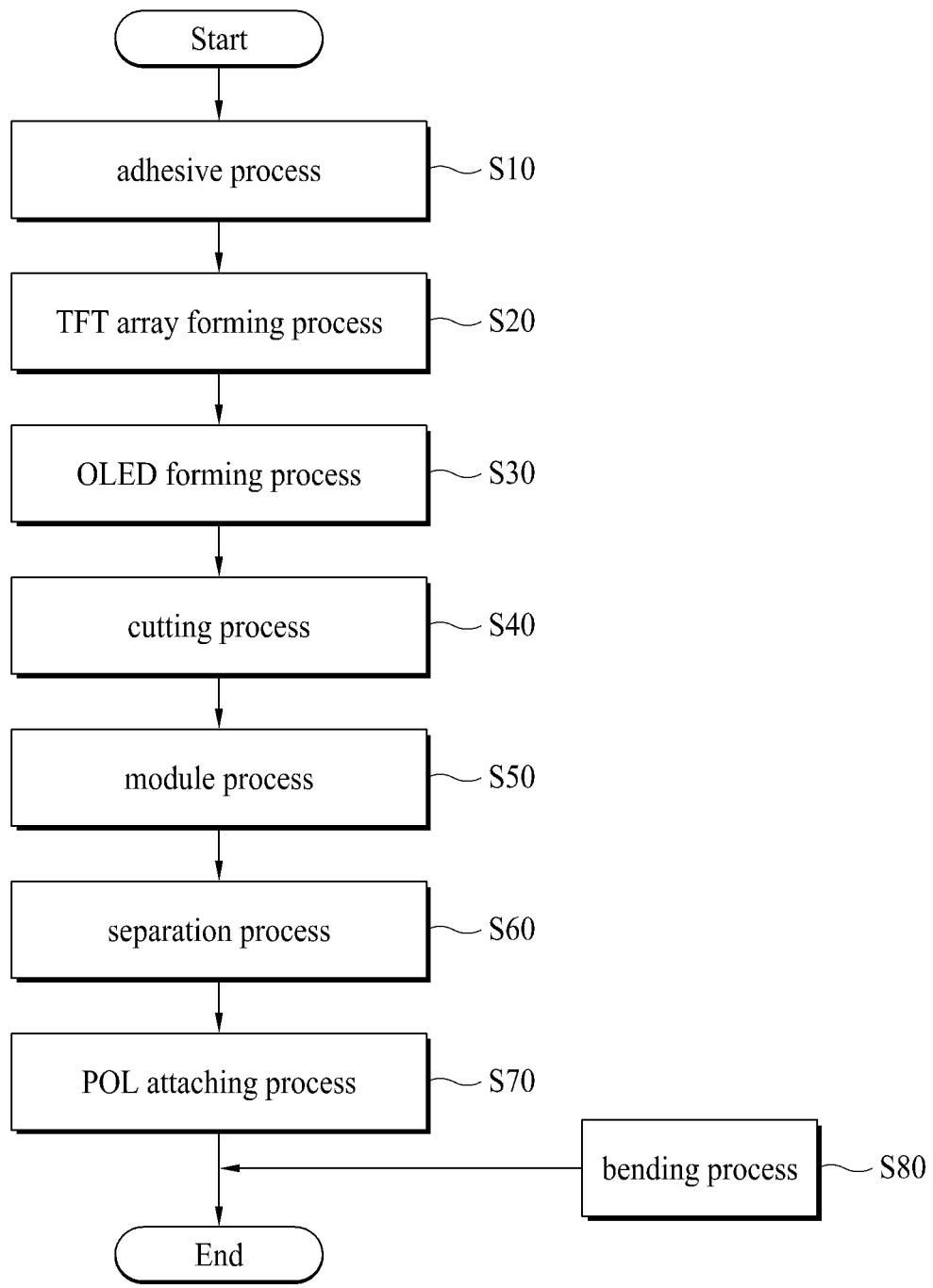

FIGS. 9A and 9B are flow charts of a method for fabricating a flexible display device according to the second example embodiment of the present invention. FIGS. 10A to 10H illustrate a method for fabricating a flexible display device according to the second example embodiment of the present invention.

With reference to FIGS. 9A and 9B, a method for fabricating the flexible display device according to the second example embodiment includes a step (first process) S10 of attaching a mother flexible substrate MS to a support substrate 1000, a step (second process) S20 of forming the thin film transistor array 210 on the mother flexible substrate MS, a step (third process) S30 of forming an organic light emitting diode on the thin film transistor array 210, a step (fourth process) S40 of cutting the mother flexible substrate MS, a module step (fifth process) S50 of connecting the driving circuit 400 to a unit area UA formed by cutting of the mother flexible substrate MS, a step (sixth process) S60 of separating the support substrate 1000 from the mother flexible substrate MS, and a step (sixth process) S70 of attaching the polarizing film 700 to each unit area UA.

In the second example embodiment, the method further includes a step (eighth process) S80 of bending the mother flexible substrate MS after cutting the mother flexible substrate MS. The eighth process S80 may be performed before or after the step of attaching the polarizing film 700 to each unit area UA.

Figure 10A:
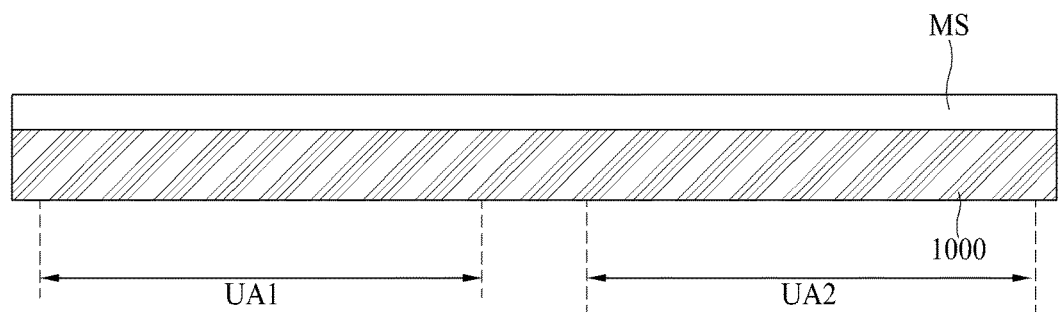
FIGS. 10A to 10H illustrate a method for fabricating a flexible display device according to the second example embodiment of the present invention.

With reference to FIG. 10A, the first process S10 is to attach the mother flexible substrate MS to the support substrate 1000 to facilitate handling of the mother flexible substrate MS during the processes. The support substrate 1000 is attached to the rear surface of the flexible substrate 100 such that the mother flexible substrate MS is neither bent nor distorted during a later process. To this end, a glass substrate thicker than the mother flexible substrate MS may be used as the support substrate 1000.

The mother flexible substrate MS is divided into a plurality of unit areas UA. Each of the plurality of unit areas UA corresponds to a single unit display device.

Figure 10B:
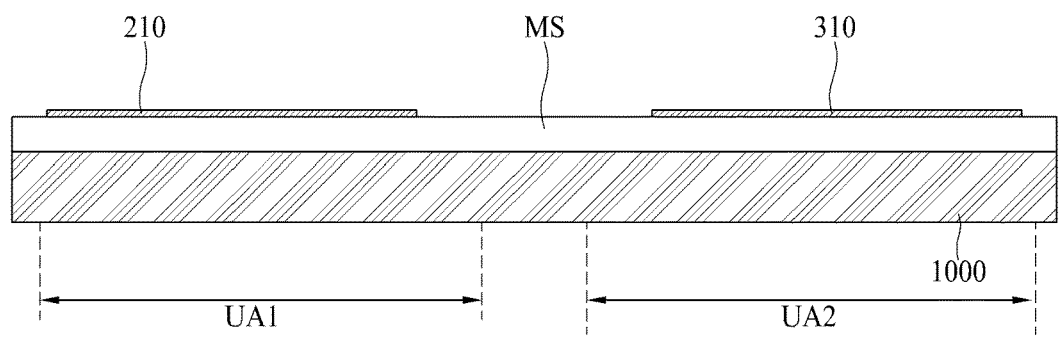

With reference to FIG. 10B, the second process S20 is to form the thin film transistor array 210 after the first process S10. The thin film transistor array 210 is formed per the plurality of unit areas UA. The thin film transistor array 210 includes gate lines, data lines crossing the gate lines, a plurality of signal transmission lines, a plurality of pad electrodes, and a thin film transistor connected to the gate and data lines.

The second process S20 includes the step of forming a gate driver and a plurality of gate signal lines TL2, which are connected to the gate driver, between neighboring unit areas UA adjacent to each other. In this example, the gate driver includes first and second gate drivers 230 and 240 arranged to be adjacent to each other. The first gate driver 230 is connected to the first unit area UA of the neighboring unit areas, which is arranged at one side, and the second gate driver 240 is connected to the second unit area UA of the neighboring unit areas, which is arranged at the other side.

Figure 10C:
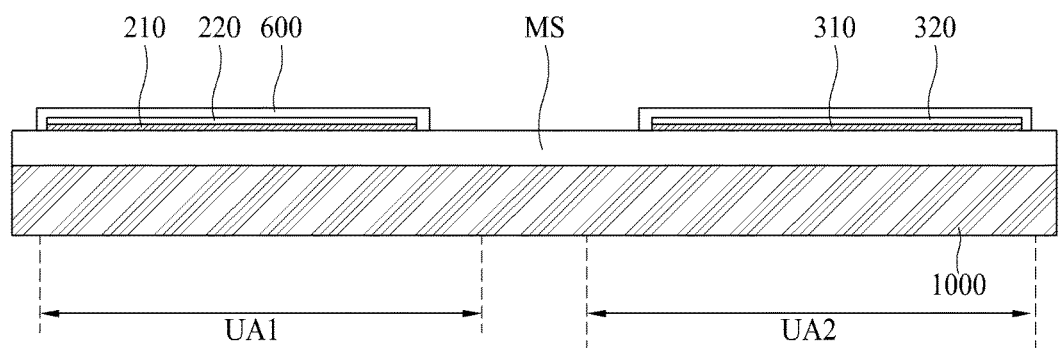

With reference to FIG. 10C, the third process S30 is to form the organic light emitting diode after the second process S20. The organic light emitting diode is formed for each of the plurality of unit areas UA. The organic light emitting diode is divided into the first light emitting device 220 and the second light emitting device 320 during a later process. In more detail, in the later fourth process S40, the mother flexible substrate MS is cut on a basis of two unit areas UA, whereby the organic light emitting diode is divided into the first organic light emitting diode 220 and the second organic light emitting diode 320, which are arranged respectively in two unit areas UA.

Figure 10D:
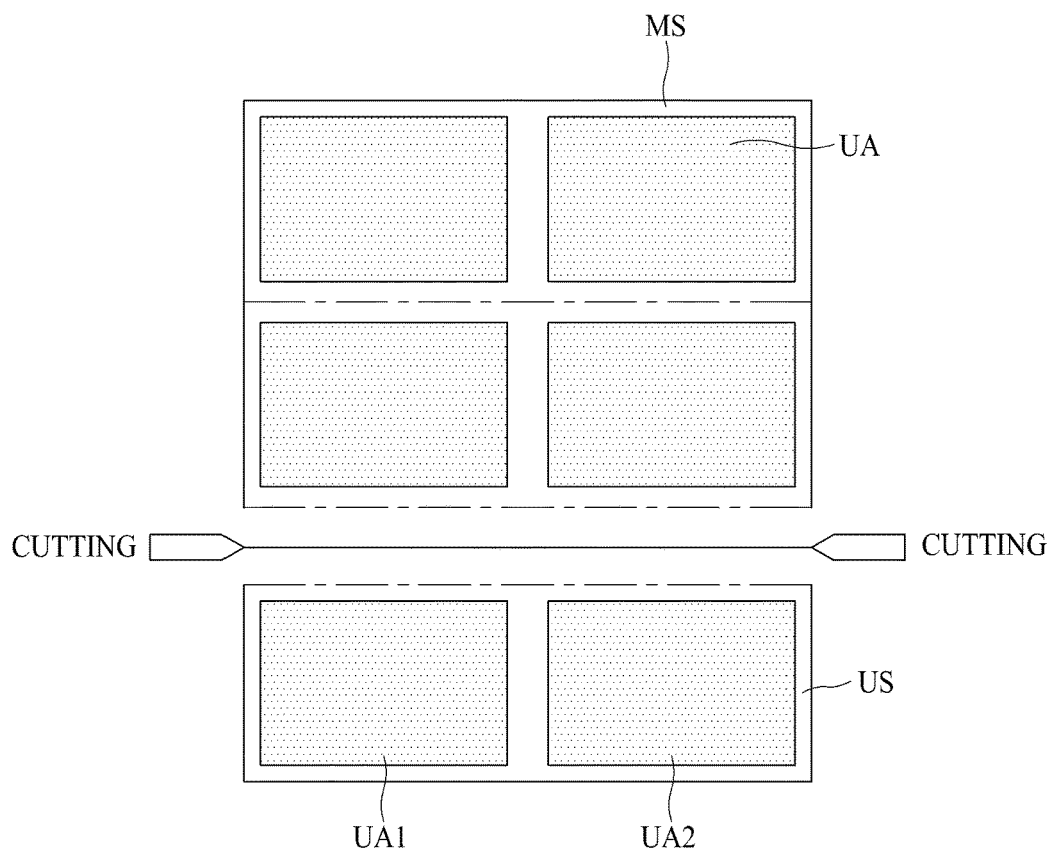

With reference to FIG. 10D, the fourth process S40 is to cut the mother flexible substrate MS on a basis of two unit areas UA after the third process S30. In more detail, the fourth process S40 is to cut the mother flexible substrate MS on a basis of the outside of the unit area UA in accordance with the intended use of the display and/or design specifications. The method for fabricating the flexible display device according to the second example embodiment may facilitate realization of a multi-vision display device by cutting two unit areas UA at a time, and thereby improve process throughput.

Hereinafter, for convenience of description, each mother flexible substrate MS separated by cutting two unit areas UA during the fourth process S40 will be termed a "unit flexible substrate US".

Figure 10E:
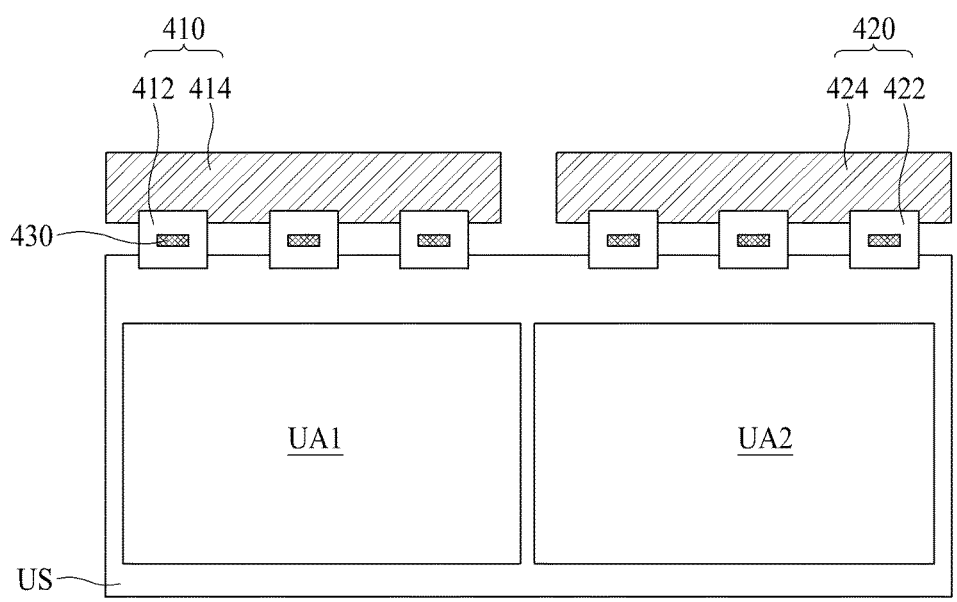

With reference to FIG. 10E, the fifth process S50 is to connect the driving circuit 400 after the fourth process S40. In more detail, the fifth process S50 is to connect the driving circuit 400 to a plurality of pads formed on the unit flexible substrate US during the second process S20. At this time, the circuit films 412 of the driving circuit 400 are connected to the plurality of pads in a type of tape automated bonding (TAB). Therefore, each unit area UA is connected to the printed circuit board 414 through the circuit films 412.

Figure 10F:
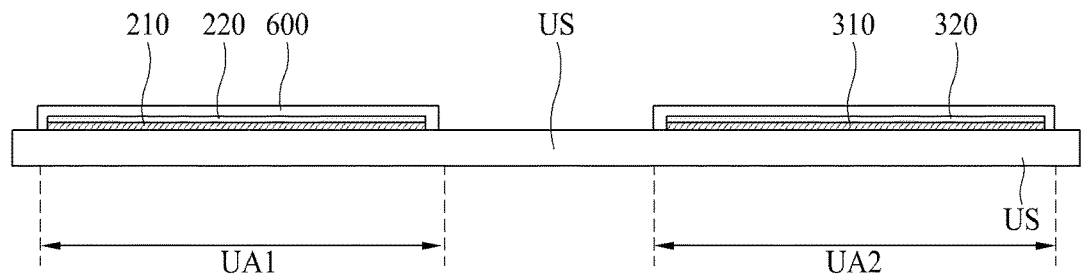

With reference to FIG. 10F, the sixth process S60 is to separate the support substrate 1000 from the unit flexible substrate US. The unit flexible substrate US has flexibility by means of the sixth process S60.

Figure 10G:
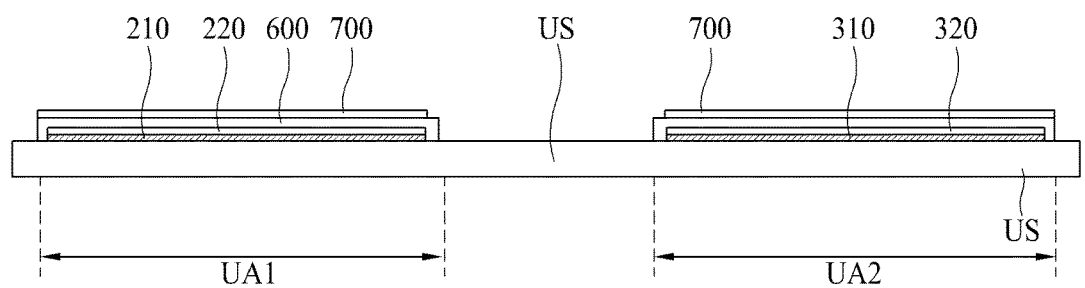

With reference to FIG. 10G, the seventh process S70 is to attach the polarizing film 700 to each unit area UA. The polarizing film 700 is attached to an encapsulation substrate 600, which encapsulates the first and second organic light emitting diodes 220 and 320, and serves to improve an ambient contrast ratio (ACR).

Figure 10H:
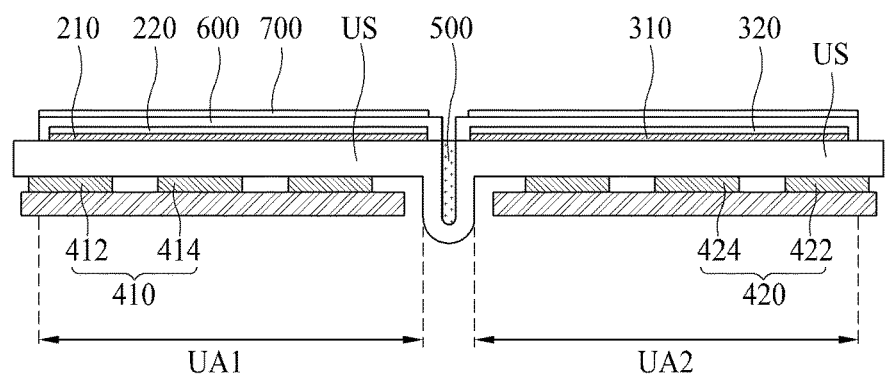

With reference to FIG. 10H, the eighth process S80 is to bend the unit flexible substrate US. In more detail, the eighth process S80 is to concavely bend the center area of the flexible substrate 100 based on the center line CL arranged between the two unit areas UA. In this eighth process S80, the printed circuit board 414 and the plurality of circuit films 412 are folded toward the rear surface of the flexible substrate 100.

Meanwhile, the eighth process S80 may use the support member 500 to bend the unit flexible substrate US. In more detail, the eighth process S80 may include the steps of arranging the support member 500 to correspond to the center line CL of the unit flexible substrate US, and concavely bending a part of the unit flexible substrate US while surrounding a surface of the support member 500.

In this example, a cross-section of the support member 500 includes a flat surface and a curved surface concavely extended from the flat surface to one side, and having a specific curvature. Therefore, one sides of the two unit areas UA are in contact with each other by interposing the flat surface of the support member 500 therebetween.

Figure 11:
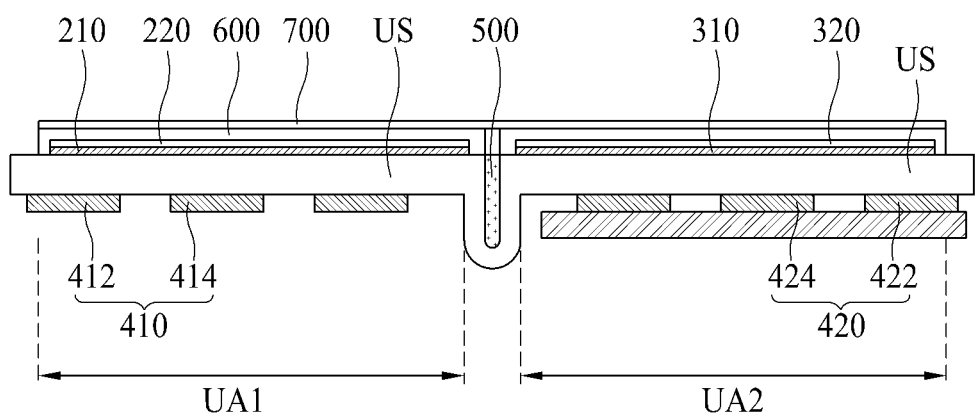
FIG. 11 is a cross-sectional view illustrating a variation of the flexible display device shown in FIG. 6.

FIG. 11 illustrates a variation of the second example embodiment. In FIG. 11, the polarizing film 700 is disposed across both of the unit areas UA1 and UA2, including above the support member 500. In this way, a seam between the unit areas UA1 and U2 may be less noticeable.

As described above, in the flexible display device according to embodiments of the present invention, one side of the flexible substrate 100 is bent, and the organic light emitting diodes 220 and 320 are respectively arranged above the first portion 110 and the second portion 120 of the flexible substrate 100, which are superimposed on each other, whereby a dual display device displaying an image in a dual direction is realized. According to embodiments of the present invention, the gate drivers and the gate signal transmission lines TL2 for transmitting the plurality of gate control signals to the gate drivers are arranged in the bending portion 130 between the first and second portions 110 and 120, whereby the width of the outer bezel area may be reduced.

Also, the method for fabricating the flexible display device according to embodiments of the present invention may facilitate realization of the dual display device by cutting two unit areas UA at a time, and thereby improve process throughput.

Also, in the flexible display device according to embodiments of the present invention, the first and second display units 200 and 300, which may be driven independently from each other, are connected with each other, whereby the multi-vision display device may be provided. As the bending portion arranged 130 between the first and second display units 200 and 300 is bent concavely, the width of the non-display area may be reduced, and the seam area between the first and second display units 200 and 300 may be realized to be close to or about zero. Therefore, in embodiments of the present invention, a large scale TV, such as a 100 inch-TV, may easily be fabricated, and its fabricating cost may be reduced.

Also, in embodiments of the present invention, because the first and second display units 200 and 300, which are independent from each other, may be connected to each other, a large scale TV may be realized. Therefore, 120 Hz driving, which is difficult to realize in the conventional large-scale display device due to RC delay, may herein be realized more easily, whereby images of high quality may be provided.

Also, methods for fabricating the flexible display device according to example embodiments of the present invention may facilitate realization of the multi-vision display device by cutting two unit areas UA at a time, and thereby improve process throughput.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A flexible display device, comprising:
   a flexible substrate having a first and second side including:
      first and second portions along with the first side that overlap each other, and
      a bending portion provided along with the second side and in a center line of the first side and connecting the first portion with the second portion;
   a first display having a first organic light emitting diode on the first portion, the first display configured to display an image in a first direction;
   a second display having a second organic light emitting diode on the second portion, the second display configured to display an image in a second direction;
   a first gate driver on the bending portion, the first gate driver configured to drive gate lines in the first display;
   a second gate driver on the bending portion, the second gate driver configured to drive gate lines in the second display;
   at least one first driving circuit connected to one side of the first portion, the at least one first driving circuit configured to supply a plurality of first driving signals to the first display; and
   at least one second driving circuit connected to one side of the second portion, the at least one second driving circuit configured to supply a plurality of second driving signals to the second display,
   wherein a plurality of gate signal transmission lines for transmitting a plurality of gate control signals from the first and second driving circuits to the gate drivers are in the bending portion, and
   the first side is longer than the second side in the flexible substrate.

2. The flexible display device of claim 1, wherein the flexible substrate is bent based on a center line in the bending portion.

3. The flexible display device of claim 1, wherein the first and second portions have the same shape and area as each other.

4. A method for fabricating a flexible display device, the method comprising:
   attaching a mother flexible substrate to a support substrate;
   forming a thin film transistor array on the mother flexible substrate to define a plurality of unit areas;
   forming a first gate driver and a second gate driver on a bending portion;
   forming an organic light emitting diode on the thin film transistor array;
   forming a unit flexible substrate having a first and second side by cutting the support substrate and the mother flexible substrate to include a first unit area and a second unit area adjacent to each other and along with the first side;
   connecting respective first and second driving circuits to each of the two unit areas;
   separating the support substrate from the unit flexible substrate; and
   bending the unit flexible substrate based on a center line between the first unit area and the second unit area such that the first unit area and the second unit area overlap with each other,
   wherein the bending portion is disposed between the first unit area and the second unit area and provided along with the second side and in a center line of the first side,
   wherein the forming the first and second gate drivers includes forming a plurality of gate signal transmission lines between the first and second unit areas adjacent to each other,
   wherein the plurality of gate signal transmission lines connect the first and second gate drivers to the respective first and second driving circuits, and
   wherein the first side is longer than the second side in the flexible substrate.

5. The method of claim 4, wherein the first gate driver is connected to the first unit area and the second gate driver is connected to the second unit area, and the first and second gate drivers are adjacent to each other.

6. A flexible display device, comprising:
   a flexible substrate having a first and second side including:
   a bending portion concavely bent along a center line of the first side, the bending portion being provided along with the second side, and
   first and second portions at opposite ends of the bending portion, the first and second portions being along with the first side;
   a first display having a first organic light emitting diode on the first portion;
   a second display having a second organic light emitting diode on the second portion; and
   a support member on the bending portion to support the flexible substrate,
   wherein the support member is provided on a first surface of the flexible substrate, and the first display and the second display are provided on the first surface of the flexible substrate and
   the first side is longer than the second side in the flexible substrate.

7. The flexible display device of claim 6, wherein a cross-section of the support member includes:
   a flat surface having the same height as the first and second portions; and
   a curved surface concavely extended from the flat surface to a lower side, and having a specific curvature.

8. The flexible display device of claim 7, wherein:
one side of the first display and one side of the second display are in contact with each other by interposing the flat surface of the support member therebetween; and
the first display and the second display are configured to display an image in a same direction.

9. A method for fabricating a flexible display device, the method comprising:
attaching a mother flexible substrate to a support substrate;
forming a thin film transistor array on the mother flexible substrate to define a plurality of unit areas;
forming an organic light emitting diode on the thin film transistor array;
forming a unit flexible substrate having a first and second side by cutting the support substrate and the mother flexible substrate to include two unit areas adjacent to each other, the two unit areas being along with the first side;
connecting a driving circuit to each of the two unit areas;
separating the support substrate from the unit flexible substrate;
arranging a support member to correspond to a center line of the first side; and
concavely bending the unit flexible substrate along with the second side based on the center line between the two unit areas to allow one side of one of the two unit areas to be in contact with one side of the other one of the two unit areas,
wherein the support member is provided on a first surface of the flexible substrate, and the two unit areas are provided on the first surface of the flexible substrate, and
the first side is longer than the second side in the flexible substrate.

10. The method of claim 9, wherein the bending the unit flexible substrate includes concavely bending the part of the unit flexible substrate while surrounding a surface of the support member.

11. The method of claim 10, wherein a cross-section of the support member includes:
a flat surface; and
a curved surface concavely extended from the flat surface to one side, and having a specific curvature.

12. The method of claim 11, wherein:
one sides of the two unit areas are in contact with each other by interposing the flat surface of the support member therebetween; and
the two unit areas are configured to display an image in a same direction.

\* \* \* \* \*